United States Patent [19]

Prager et al.

[11] Patent Number: 4,558,914

[45] Date of Patent: Dec. 17, 1985

[54] READILY EXPANDABLE INPUT/OUTPUT CONSTRUCTION FOR PROGRAMMABLE CONTROLLER

[75] Inventors: Jay M. Prager, Nashua, N.H.; Roman Y. Gonzales, Andover, Mass.

[73] Assignee: Gould Inc., Rolling Meadows, Ill.

[21] Appl. No.: 422,268

[22] Filed: Sep. 23, 1982

[51] Int. Cl.⁴ ............................................. H01R 13/62
[52] U.S. Cl. .................. 339/75 R; 339/49 R; 339/91 R; 361/393; 361/413
[58] Field of Search ............... 339/75 R, 75 M, 91 R, 339/47 R, 49 R; 361/393, 394, 395, 396, 413

[56] References Cited

U.S. PATENT DOCUMENTS

| | | | |
|---|---|---|---|
| 3,209,303 | 9/1965 | Uberbacher | 339/91 R |
| 3,425,025 | 1/1969 | Williams | 339/75 M |
| 3,656,085 | 4/1972 | Holiday | 339/91 R |
| 3,740,696 | 6/1973 | Schleicher et al. | 339/75 M |
| 4,130,329 | 12/1978 | Chandler et al. | 339/91 R |
| 4,215,386 | 7/1980 | Prager et al. | 361/390 |
| 4,332,432 | 6/1982 | Colleran | 339/75 M |
| 4,344,663 | 8/1982 | Osnier et al. | 339/91 R |
| 4,501,460 | 2/1985 | Sisler | 339/49 R |

FOREIGN PATENT DOCUMENTS 8101772 6/1981 PCT Int'l Appl. ............... 339/91 R

OTHER PUBLICATIONS

Conference: Thirteenth Annual Connector Symposium Proceedings, Philadelphia, PA, USA, pp. 121-128 by Colleran.

*Primary Examiner*—Gil Weidenfeld
*Assistant Examiner*—Thomas M. Kline
*Attorney, Agent, or Firm*—Mattern, Ware, Stoltz & Fressola

[57] ABSTRACT

By providing an input/output module which incorporates post means formed thereon and slider means connected thereto and movable into and out of locking engagement with the post means of an adjacent module, a unique input/output module is achieved that is rapidly mounted to an adjacent module as well as rapidly disconnected therefrom. Preferably, each input/output module incorporates mating connector means positioned on opposite surfaces thereof, whereby each input/output module electronically directly connects to an adjacent module for communication with a central processor.

6 Claims, 11 Drawing Figures

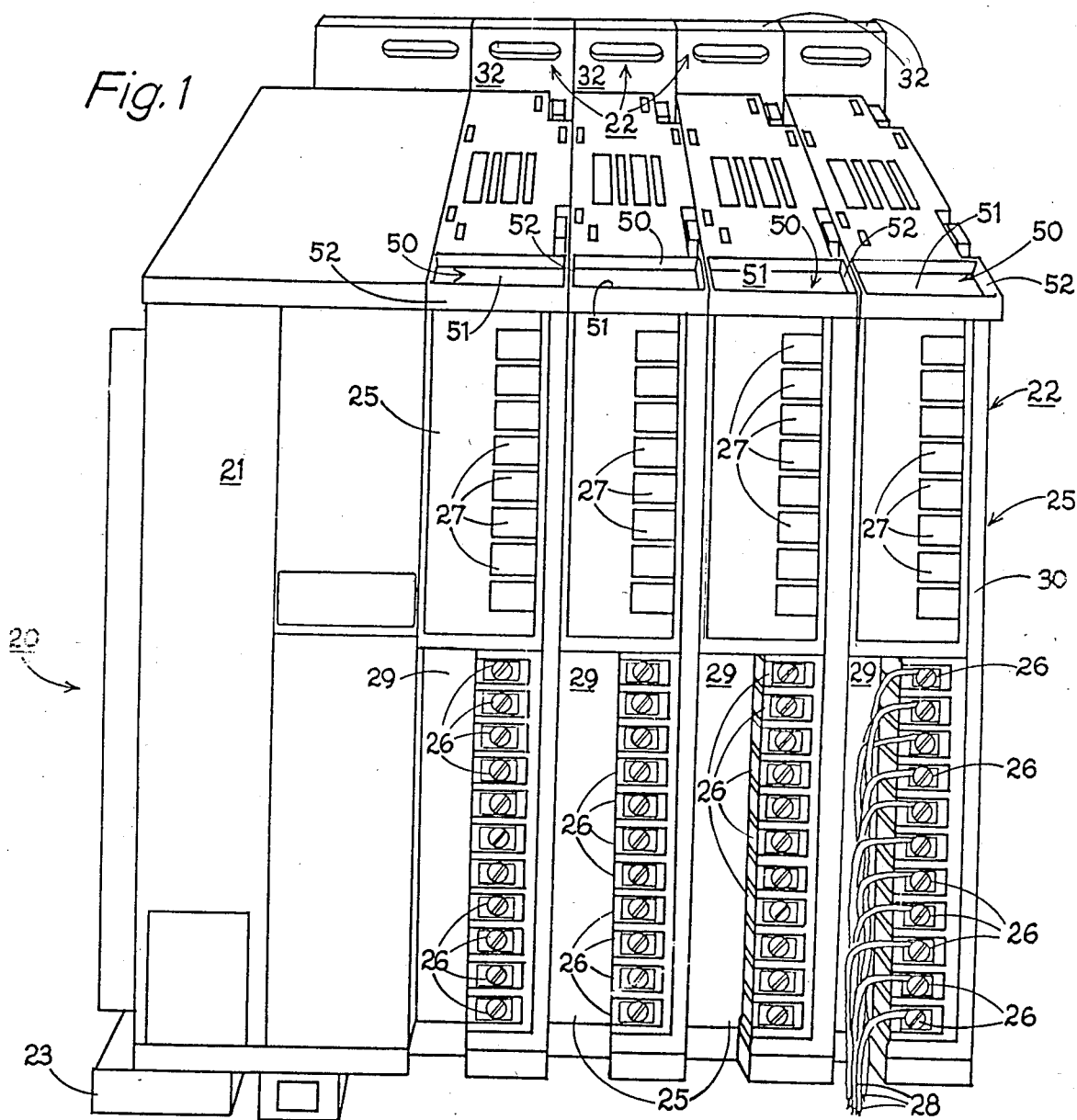
Fig. 1
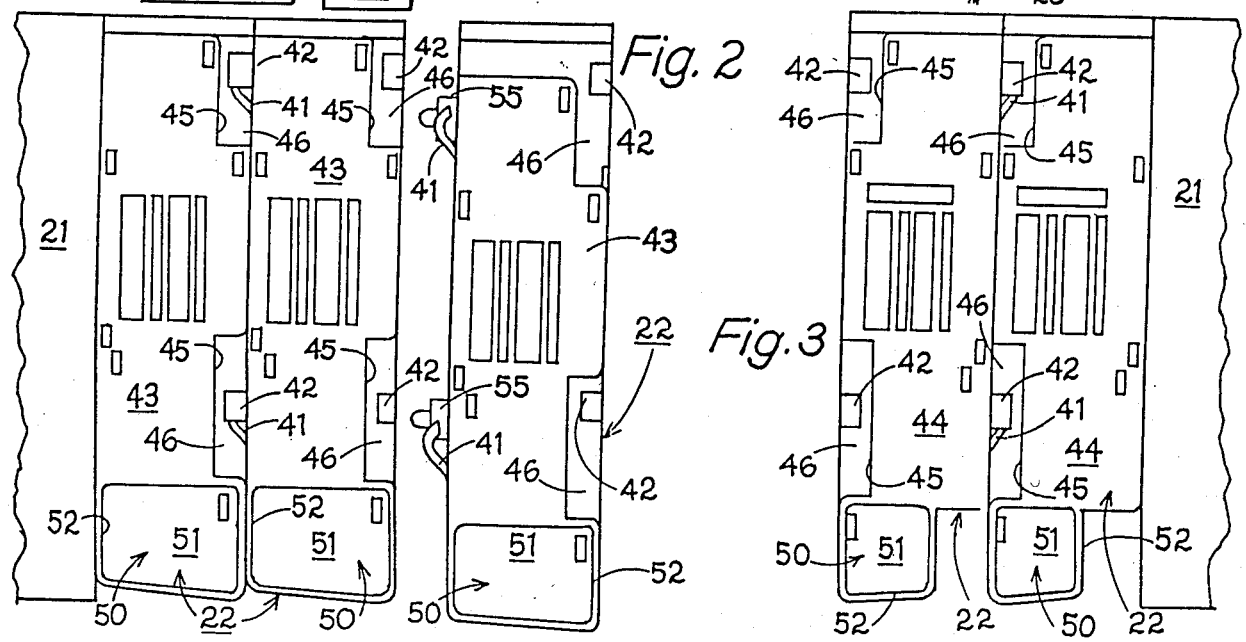
Fig. 2
Fig. 3

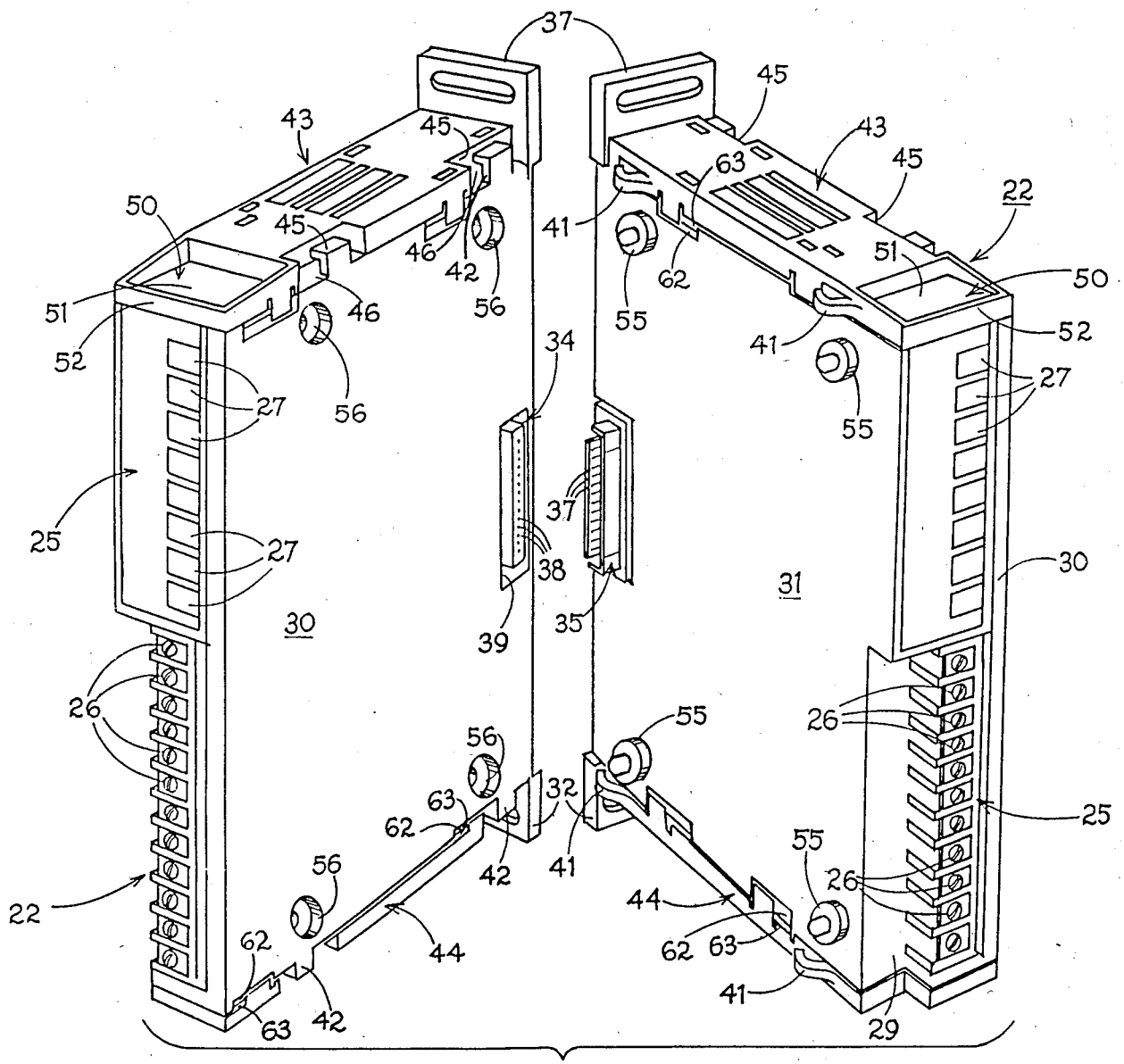
Fig. 4
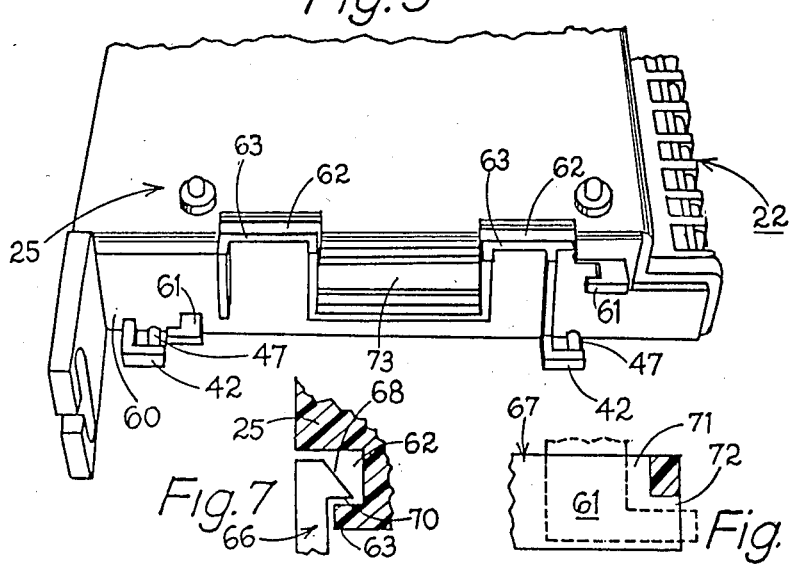
Fig. 5
Fig. 7
Fig. 8
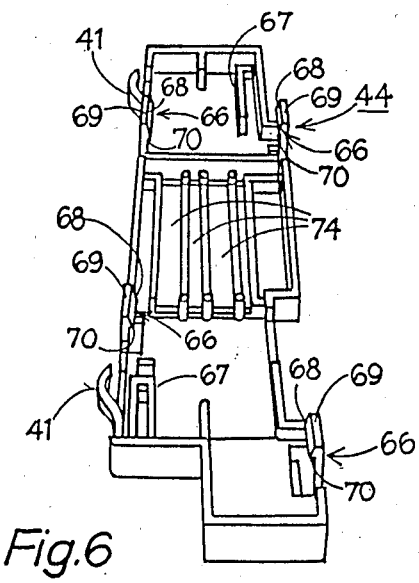
Fig. 6

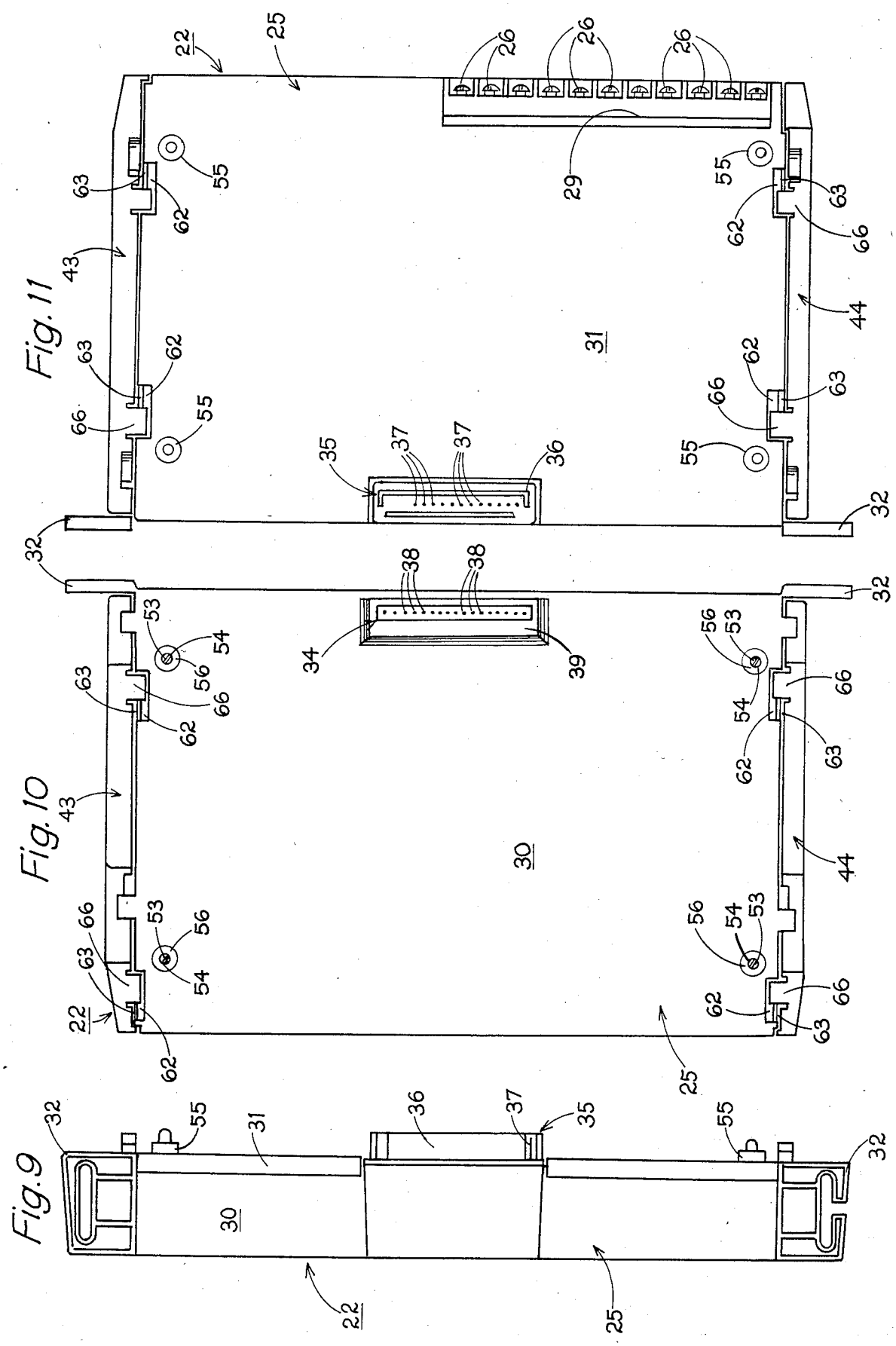

READILY EXPANDABLE INPUT/OUTPUT CONSTRUCTION FOR PROGRAMMABLE CONTROLLER

TECHNICAL FIELD

This invention relates to programmable controllers and more specifically to expandable, multi-purpose input/output systems for use therewith.

BACKGROUND ART

Recently, many advances have been made in modular input/output panel constructions for providing programmable controllers. These advances have typically centered upon increased maneuverability, accessibility, insertibility, and removability of input/output modules and their interconnectibility with external equipment wiring. However, in order to provide this input/output module flexibility, expensive interfacing, interconnecting, and supporting equipment is required.

In particular, these typical prior art systems all require a backplane housing into which the module is interconnected in order to provide the communication between the input/output module and the central processing unit. In addition, the module is also supportingly maintained in a housing or rack system to assure that it is maintained securely in position. Furthermore, such constructions leave obvious, aestetically unpleasing void zones if fewer modules are required than the maximum module capability of the controller.

Furthermore, external equipment wiring must be made either directly to the module or, alternatively, to an interfacing terminal connector block to which the module may be engaged or disengaged, as so desired. Typical systems which exemplify this prior art are found in U.S. Pat. No. 3,942,077 of Howard A. Powers, and U.S. Pat. No. 4,215,386 of Jay M. Prager et al.

Although these prior art systems efficiently attain their desired goals, the increased cost of manufacture for the various component parts required in these systems has prevented some potential users from being able to incorporate these systems due to their inherent initial costs. As a result, these potential users who would otherwise benefit from the systems' capabilities have been required to forego the advantages that might otherwise be enjoyed by employing a programmable controller.

Consequently, it is a principal object of this invention to provide an input/output assembly for a programmable controller which incorporates a lightweight, easily handled, readily expandable, input/output module which eliminates necessity for expensive associated support equipment and achieves an input/output system comparatively inexpensive to prior art input/output systems.

Another object of this invention is to provide an input/output assembly for a programmable controller having the characteristic features defined above wherein the input/output modules are quickly and easily securely mountingly engaged to adjacent input/output modules in order to allow the user to expand the system as expansion becomes required, without detracting from the system's performance or appearance.

Another object of the present invention is to provide an input/output assembly for programmable controller having the characteristic features defined above which also provides for quick and easy interconnection of external device wiring directly to the desired module.

A further object of this invention is to provide an input/output assembly for a programmable controller having the characteristic features defined above which is capable of rapid assembly and disassembly without requiring soldering, thereby assuring easy and reliable field maintenance while also being reliable and reasonably priced.

Another object of this invention is to provide an input/output assembly for a programmable controller having the characteristic features defined above which is quickly and easily expanded by simply assembling and interconnecting additional input/output modules to the existing input/output module up to the maximum capability of the central processor.

Other and more specific objects will in part be obvious and will in part appear hereinafter.

DISCLOSURE OF THE INVENTION

The input/output assembly of the present invention eliminates the prior art difficulties by providing a lightweight, substantially self-contained, easily handled input/output module which is securely mountable and electrically interconnected to a previously mounted input/output module. Each module is directly electronically engaged with the adjacent module, while also being mechanically connected thereto by simple, easily employed snap mounting means.

In the preferred embodiment, each input/output module incorporates a pair of post members which are formed on one side thereof along both the top and bottom edges. In addition, a movable slider member is slidably engaged with the top and bottom surfaces of the input/output module, with each slider being movable between two alternate positions.

Each slider member incorporates flexible, interlocking fingers extending from one edge of the slider member, positioned for interconnected engagement with the post members. In this way, each input/output module of the present invention is quickly and easily secured to a previously mounted module by merely positioning a newly added module in abutting contact with the previous module and moving the slider member from its disengaged position to its engaged position, wherein the interlocking finger members of the newly added module move into secure locked engagement with the post members of the previously mounted module.

In addition, each input/output module of the present invention also incorporates aligning bosses extending from one surface thereof which mate with boss-receiving recesses formed in the opposed surface thereof. As a result, each newly added module is assured of being positioned in the desired location and orientation, with locking fingers aligned for interconnecting engagement with the posts.

In the preferred embodiment, each slider member is engaged with portions of the edges of the input/output module which assure the sliding movability of the slider member along a specifically defined length. In addition, the input/output modules of the present invention also incorporate slider holding means to retain each slider in engagement with the housing of the input/output module when the slider member is disengaged from the edge portion, as is required when disengaged disassembly of the housing itself becomes necessary. In this way, accidental loss or damage to the slider is avoided, while also allowing the slider to be easily moved out of holding engagement with the housing for its complete removal.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature and objects of the invention, reference should be had to the detailed description taken in connection with the accompanying drawings, in which:

FIG. 1 is a perspective view of a programmable controller incorporating the input/output module assembly of the present invention;

FIG. 2 is a top plan view of the programmable controller of FIG. 1 with two input/output modules of the present invention shown in the assembled position, with a third input/output module in the process of being assembled;

FIG. 3 is a bottom plan view of the programmable controller of the present invention incorporating two input/output modules of the present invention;

FIG. 4 is a perspective view showing two input/output modules of the present invention separated, prior to being positioned in locked interengagement;

FIG. 5 is a perspective view of the lower portion of an input/output module of the present invention shown with the movable locking slider removed;

FIG. 6 is a perspective view of the top surface of a bottom slider;

FIG. 7 is a fragmentary view, partially in cross section, of a slider tab member engaged with the housing's recess and ledge;

FIG. 8 is a fragmentary view, partially in cross section, showing the housing's L-shaped fin engaged within the portal of the slider's channel;

FIG. 9 is a rear elevation view of one input/output module of the present invention;

FIG. 10 is a side elevation view of one input/output module of the present invention; and FIG. 11 is an opposite side elevation view of one input/output module of the present invention.

BEST MODE FOR CARRYING OUT THE INVENTION

In FIG. 1, programmable controller 20 is shown incorporating a central processing unit 21 and a plurality of input/output modules 22 connected thereto. As is well known in the art, programmable controller 20 is constructed to receive information from a user's external devices, process this information and, in accordance with particular preset instructions, provide output information to control the operation of the user's equipment.

Central processing unit 21 incorporates a power supply portion which drives central processor 21, input/output modules 22, and a removable program module 23 which is interconnected with central processing unit 21 to establish the desired controlling program.

In the present invention, an efficient and highly effective programmable controller is achieved at a cost that is comparatively inexpensive, by providing input/output modules 22 that are quickly and easily mounted to each other, as well as simultaneously electrically connected directly to the operating system. In addition, the user's external equipment is directly connected to the desired module. As a result, the present invention achieves an input/output module construction which can be easily expanded when needed.

In the preferred embodiment, each input/output module 22 is capable of handling eight independent circuits, with each module being physically constructed as either an input module or an output module depending upon the circuitry employed within the module. In this way, eight separate external devices are controlled by a single output module, while eight separate external devices are monitored by a single input module. Throughout this application, input modules and output modules will be referred to as input/output modules 22, since their external construction and operation, which forms the subject matter of the present invention, are identical regardless of whether the module is an input module or an output module.

As shown throughout the drawings, each input/output module 22 incorporates a single unitary housing 25 constructed for rapid mechanical and electronical interconnection with identical, adjacent input/output modules. As is fully discussed below, the preferred embodiment of housing 25 comprises two mating sections 30 which are capable of quick and easy assembly or disassembly. Contained within housing 25 is a printed circuit board upon which is mounted the required electronic assembly specifically designed for the particular information and equipment to which input/output module 22 is to be connected.

In addition, housing 25 of input/output module 22 incorporates a plurality of independent wire connection points 26 and a plurality of status indicating windows 27, all of which are formed on the front forward facing edge of housing 25. Since each input/output module 22 is preferably constructed to accommodate eight independent input or output circuits, eight status indicating windows 27 are formed in housing 25, with each window housing an LED for indicating to the user the particular status of that particular circuit.

The plurality of wire connection points 26 are employed for direct interconnection of the user's external equipment to input/output modules 22. In this way, the particular equipment being operated or monitored by input/output module 22 is directly electrically connected to its particular input/output module 22 in order to assure its controlled operation by programmable controller 20. In the preferred embodiment, each independent wire connection point 26 incorporates a conventional screw terminal which is dimensioned to accept up to two AWG 14 wires. In addition, each screw terminal is independent and is electrically isolated from adjacent terminals, in order to assure independent controlled operation of the equipment connected thereto.

As best seen in FIG. 1, housing 25 of each input/output module 22 is preferably formed with an elongated notched area 29 directly adjacent the plurality of wire connection points 26. Notched area 29 establishes an elongated channel within which wires 28 from the user's external equipment can be easily and conveniently positioned for direct electronic engagement with wire connection points 26.

In order to directly electronically connect each input/output module 22 to adjacent input/output modules as well as processing unit 21, each input/output module 22 incorporates rear connectors 34 and 35 which are positioned on opposite sides of input/output module 22. As shown in FIGS. 4, and 9–11, rear connector 35 incorporate a tongue portion 36 which extends outwardly from the rear side surface 31 of section 30 of housing 25 of input/output module 22, with a plurality of upstanding pin members peripherally surrounded by and contained within tongue portion 36.

Cooperating connector 34 is positioned in the side surface of section 30 of housing 25 of input/output module 22 in position for mating electronic interengagement with connector 35. In the preferred embodiment, connector 34 incorporates a plurality of pin receiving zones 38 formed therein, each positioned for mating electronic interengagement with pins 37 of connector 35. In addition, section 30 of housing 25 of input/output module 22 incorporates a tongue receiving recess 39 peripherally surrounding connector 34 and dimensioned for assuring sliding mating engagement of tongue portion 36 of connector 35 within recess 39. In this way, pin members 37 of connector 35 are capable of penetrating pin receiving recesses 38 of connector 34 and assure the desired electronic interengagement therebetween.

As is readily apparent to one having ordinary skill in this art, any rear connection system could be employed in order to interconnect adjacent input/output modules 22 with processing unit 21, without departing from the scope of the present invention. These alternative connection systems include conventional rear connectors commonly employed in this industry. However, for the purposes of the present invention, it has been found that side mounted, prepositioned connectors 34 and 35 achieve the desired electrical interconnection in a simple convenient and inexpensive manner, thereby assisting in attaining the objects of the present invention.

In addition, housing 25 of each input/output module 22 incorporates mounting flange 32, preferably positioned at the top and bottom of the rear surface of module 22. In this way, each input/output module 22 is able to be easily and conveniently independently secured directly to a support panel or wall. This allows any number of newly installed input/output modules to be mounted wherever desired, without empty spaces being evident, as well as allowing subsequently required additional modules to be added and mounted in position without causing any evident disruption or aesthetic change.

In order to assure that each input/output module 22 is quickly and easily mounted in locked interengagement with adjacent input/output modules 22, each input/output module 22 incorporates a module interlocking and interconnecting system. In the preferred embodiment, the module interlocking and interconnecting system of the present invention comprises movable, flexible, interlocking, connecting fingers 41 and cooperating rigidly mounted posts 42. Preferably, two interlocking, connecting fingers 41 are mounted on a top slider member 43 and two interlocking, connecting fingers 41 are similarly mounted on a bottom slider member 44. Both sliders 43 and 44 are movably secured to housing 25 of input/output module 22 in position for locking engagement with posts 42, thereby assuring secure interlocking interconnection of each input/output module 22 with adjacent input/output modules.

As best seen in FIGS. 2, 3 and 6, flexible interlocking connecting fingers 41 extend outwardly from the sides of sliders 43 and 44, and are dimensioned for partially surrounding posts 42 of the adjacent input/output module to assure secure retained engagement therewith. In order to attain an input/output module 22 which is rapidly and easily positioned in locked interengagement with an adjacent input/output module 22 or, alternatively, rapidly disengaged from an adjacent input/output module 22, sliders 43 and 44 are constructed for movement between a forward, disengaged position and a rearward locked, engaged position.

In FIG. 2, two adjacent input/output modules 22 are shown in locked interengagement with each other, with sliders 43 of both input/output modules 22 shown in their rearwardmost, locked, interengaged position. The third input/output module 22 is shown just prior to being engaged with the adjacent input/output module 22. In this configuration, slider 43 is shown in its forwardmost, unlocked, disengaged position.

As shown in FIG. 2, when slider 43 is in its forwardmost disengaged position, flexible, curved, interlocking connecting fingers 41 are aligned with the open finger-receiving zones 46, which are located forward of posts 42. Open fingerreceiving zones 46 are defined by notched areas 45 formed in the edges of each top slider 43.

In order to securely lockingly engage one input/output module 22 with an adjacent input/output module 22, the modules are positioned with adjacent sides of the two input output modules 22 in abutting contact with each other, and with flexible, curved interlocking, connecting fingers 41 of slider 43 of the newly added input/output module 22 being positioned forward of posts 42 within open finger-receiving zones 46. Then, slider 43 is slidingly moved to its rearwardmost position, causing interlocking connecting fingers 41 to move rearwardly into surrounding interlocking connected engagement with posts 42 of the adjacent input/output module 22. In this way, any number of additional input/output modules 22 are quickly and easily mounted in interlocked engagement with the previously mounted input/output module.

As best seen in FIG. 3, bottom slider members 44 incorporate identical features of construction as discussed above in reference to top sliders 43, with the only difference being that bottom sliders 44 are mirror images of top sliders 43. As a result, top sliders 43 and bottom sliders 44 have vertical commonality, with fingers 41 and notched areas 45 being on identical sides of module 22 when sliders 43 and 44 are mounted thereto. In addition, this mirror image construction assures that a top slider 43 cannot be accidentally substituted for bottom slider 44. As is readily apparent from this description, bottom slider members 44 move between their unlocked position and their interlocked connected position in a manner identical to the process defined above.

As shown in FIG. 5, each post 42 incorporates a rounded rib portion 47. Each rib portion 47 is dimensioned for mating locked engagement with a flexible, curved interlocking, connecting finger 41. The curvature of each rib portion 47 is designed to cause fingers 41 to flex outwardly from rib portion 47 as the slider 43/44 is moved rearwardly. Then, as the leading edge of curved finger 41 passes beyond rib portion 47, finger 41 flexes back to its original position with the curved portion thereof, peripherally surrounding and embracing rib portion 47. As a result, secure, locked engagement of fingers 41 with posts 42 is assured.

In order to assist the operator and assure that top and bottom sliders 43 and 44 are easily moved between their disengaged, unlocked positions and their locked interconnected positions, sliders 43 and 44 incorporate movement control zones 50, each of which comprise a substantially flat base surface 51 partially surrounded by an upstanding flange 52. By employing movement control zone 50 of sliders 43 and 44, the operator is capable of quickly and easily manipulating sliders 43 and 44 between their two alternate positions. As a result, input/output modules 22 can be quickly and easily moved between their disengaged positions and their locked interengaged positions.

In order to further enhance the rapid locking interengagement of an input/output module 22 to a previously mounted input/output module, input/output modules 22 each incorporate position aligning bosses 55 extending outwardly from the side surface 31 of section 30 of housing 25 of input/output module 22, with cooperating boss-receiving recesses 56 formed in the side surface of section 30 of housing 25 of input/output module 22, as shown in FIGS. 4 and 9–11. Boss-receiving recesses 56 comprise a diameter which is slightly greater than the diameter of bosses 55, thereby assuring mating receipt and engagement of bosses 55 within recesses 56. Furthermore, cooperating bosses 55 and recesses 56 are positioned on opposite side surfaces of housing 25 of input/output module 22 to assure that each input/output module 22 added to an existing input/output 22 will be aligned therewith to establish a uniform, continuous row of input/output modules. In this way, the desired alignment of interlocking connecting fingers 41 of sliders 43 and 44 with post 42 is established and interlocking engagement is assured to occur when sliders 43 and 44 are moved to their rearwardmost position.

As shown in FIG. 10, each recess 56 incorporates a smaller diametered screw hole within which a screw 53 is positioned. By employing screws 53, mating sections 30 are securely mounted together to form housing 25. In addition, this readily accessible position for screws 53 allows housing 25 to be easily disassembled to gain access to the printed circuit board contained therein.

The construction which achieves the easily executed, controlled movability of sliders 43 and 44 between their two alternate positions can best be understood by referring to FIGS. 5–8. Although FIGS. 5–8 and the following discussion are limited only to the bottom of housing 25 of the input/output module 22 and its associated bottom slider 44, this discussion applies equally to the construction and operation of top slider 43 and the top surface of housing 25 of input/output module 22. Consequently, it is understood that this detailed discussion of the construction of lower slider 44 and the bottom surface of housing 25 is made for illustrative purposes only and is intended to be equally applicable and descriptive of the construction of top slider 43 and its associated top surface of housing 25 of input/output module 22.

In FIG. 5, housing 25 of input/output module 22 is shown with bottom surface 60 incorporating two posts 42 perpendicularly extending along one edge thereof. In addition, bottom surface 60 incorporates two L-shaped fins 61 inwardly spaced from the side edges of surface 60 and extending substantially perpendicularly thereto.

Housing 25 of input/output module 22 also incorporates two recesses 62 formed in the side surface of housing 25 in juxtaposed cooperating relationship with bottom surface 60. Recesses 62 are spaced apart and extend longitudinally along a portion of the interconnecting edge between bottom surface 60 and the adjacent side surface of housing 25, thereby forming ledges 63. A pair of recesses 62 and ledges 63 are also formed along the opposite edge of bottom surface 60 and the opposite side surface of housing 25. As is more fully discussed below, recesses 62 and ledges 63 cooperate with slider 44 to define the sliding movability of slider 44 relative to housing 25.

As shown in FIG. 6, bottom slider 44 incorporates four locking tabs 66 positioned along the outer peripheral edge of slider 44 and two channels 67 positioned inwardly on the top surface of bottom slider 44. In the preferred construction, two upstanding locking tabs 66 are mounted on each longitudinal side edge of bottom slider 44, positioned for cooperative sliding engagement with recesses 62 and ledges 63. Channels 67 are positioned for cooperative sliding engagement with tab 61 of bottom surface 60 of input/output module 22.

In its preferred construction, each upstanding locking tab 66 incorporates a bevelled side surface 68, angularly slanting away from a top surface 69 until it reaches a substantially flat bottom surface 70.

With this construction, bottom slider 44 is quickly and easily securely engaged with housing 25 of input/output module 22 for sliding movement therewith. In order to secure slider 44 in position, each upstanding locking tab 66 of slider 44 is placed in juxtaposed relationship with a recess 62 and ledge 63. Then, slider 44 is advanced into engagement with housing 25 of input/output module 22 by causing bevelled surface 68 of each upstanding tab 66 to cammingly advance perpendicularly passed ledge 63, which causes each upstanding tab 66 to flex outwardly until bottom surface 70 passes by ledge 63. At this time, the inherent resiliency of each upstanding tab 66 causes tab 66 to return to its original position, with bottom surface 70 thereof in juxtaposed cooperating relationship with ledge 63, while slanted surface 68 is nested within recess 62, as clearly shown in FIG. 7.

With each of the four upstanding flexible tabs 66 secured in place, slider 44 is capable of longitudinal sliding movement between its two positions, with tabs 66 slidingly engaged within recesses 62, maintained in this position by bottom surfaces 70 and ledges 63.

As shown in FIGS. 6 and 8, each elongated channel 67 comprises an upstanding, substantially continuous wall member 71 which extends from the top surface of bottom slider 44, substantially perpendicularly thereto. At the rear of each elongated channel 67, upstanding wall member 71 wraps around the terminating end of channel 67, establishing a rear wall portion. In addition, this rear portion of wall 71 incorporates a portal 72 formed therein which extends to the top surface of bottom slider 44.

When bottom slider 44 is mounted in housing 25 of input/output module 22, L-shaped fins 61 are positioned within elongated channels 67 and channels 67 moves relative to L-shaped fins 61 when slider 44 is moved between its two alternate positions. In the preferred embodiment, when slider 44 is moved into its forwardmost, unlocked, disengaged position, the free ends of L-shaped fins 61 protrude through portal 72 of channels 67, as shown in FIG. 8. When slider 44 is moved to its rearwardmost, locked, interengaged position, L-shaped fins 61 are disengaged from portals 72 of channels 67, but are retained between channel defining walls 71.

By employing L-shaped fins 61 and cooperating elongated channels 67 with portal zones 72, a slider locking and holding system is achieved which prevents slider 44 from being lost during disassembly of housing 25. In order to disassemble mating sections 30 which form housing 25 of input/output module 22, screws 53 must be disconnected and removed. However, since tabs 66 of slider 44 are engaged with a portion of the edges of housing 25, tabs 66 must be dislodged from their sliding engaged position within recesses 62 before mating sections 30 of housing 25 can be fully separated.

In order to prevent the possible loss or damage to slider 44 when tabs 66 of slider 44 are disengaged from their recess-nested position, L-shaped fins 61 and elongated channels 67 with portals 72 cooperate to securely retain slider 44 to housing 25 even after tabs 66 have been disengaged, provided slider 44 is in its forwardmost position. If complete removal of slider 44 is desired, the slider is merely pushed rearwardly, disengaging L-shaped fins 61 from portals 72 of elongated channels 67, which thereby allows slider 44 to be completely removed.

Finally, as shown in FIGS. 5 and 6, bottom surface 60 of housing 25 of input/output module 22 incorporates an open portal 73 while bottom slider 44 incorporates a plurality of elongated open channels 74 which are aligned with portal 73 of bottom surface 60. When bottom slider 44 is secured to housing 25, its open elongated channels 74 are aligned with portal 73 and input/output module 22 is provided with vent means which allows any internal heat generated by the electrical components to be cooled through rising air currents.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patents is:

1. Input/output modules interconnectable with a central processor to form a machine controller for receiving information from and providing operating instructions to external devices, and interconnectable with adjacent previously mounted input/output modules, each of said input/output modules comprising
   A. a housing having a substantially regular parallelepiped shape and incorporating
      a. first connector means for communicating with the external devices, and
      b. second connector means adapted for electronic engagement with a mating connector for communicating with the central processor;
   B. post means extending from an external surface of said housing; and
   C. two slider members, each of which comprises mirror images of the other and are
      a. movably mounted on opposite surfaces of the housing,
      b. movable between a first disengaged position and a second post-engaged locking position, and
      c. incorporating interconnecting, locking finger means extending therefrom, positioned for locking engagement with the post means of an adjacent module when the slider is moved from its first disengaged position to its second engaged, locked position;

whereby input/output modules are quickly and easily securely mounted to, or disengaged from, each other, providing a programmable controller capable of being expanded, or repaired, rapidly and efficiently.

2. The input/output module defined in claim 1, wherein said housing further comprises
   c. plurality of aligning bossess spaced about and extending from a first surface thereof, and
   d. a plurality of boss-receiving recesses
      1. formed in a second surface, said second surface being opposite said first surface, and
      2. positioned for mating interconnection and receipt of the aligning bosses of an adjacent module, thereby assuring secure aligned interconnected engagement of one module with its adjacent module.

3. The input/output module defined in claim 1, wherein said housing is further defined as comprising
   c. ledge means formed along the edges of the surfaces to which said slider members are mounted, and
   d. position defining stop means formed at opposed ends of said ledges to define the maximum travel distance of said slider member;

and each of said slider members are further defined as comprising locking tabs slidingly engagable with said ledges for movement therealong between the defined positioned defining stop means, whereby said slider is freely movable between its two alternate positions.

4. The input/output module defined in claim 3, wherein said housing is further defined as comprising two mating sections secured to each other by removable screw means.

5. The input/output module defined in claim 4, wherein said housing further comprises at least one L-shaped fin extending from each of the surfaces to which said slider members are mounted and said slider member further incorporates an elongated fin-receiving channel incorporating a portal zone formed at one end thereof for receiving a portion of the L-shaped fin, whereby said L-shaped fin and said portal zone cooperate to securely hold the slider member to the housing when said tabs are disengaged when the slider is in one of its two alternate positions, while being freely disengagable from the housing when said slider is moved into its second alternate position.

6. The input/output module defined in claim 1, wherein the slider incorporates a finger engaging zone for allowing the operator to easily move the slider between its two alternate positions.

* * * * *